United States Patent
Kishida et al.

(10) Patent No.: US 8,372,227 B2
(45) Date of Patent: Feb. 12, 2013

(54) METHOD FOR PRODUCING MULTILAYER CERAMIC SUBSTRATE

(75) Inventors: Kazuo Kishida, Nagaokakyo (JP); Takahiro Takada, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/274,519

(22) Filed: Oct. 17, 2011

(65) Prior Publication Data

US 2012/0267037 A1    Oct. 25, 2012

Related U.S. Application Data

(63) Continuation of application No. PCT/JP2010/050322, filed on Jan. 14, 2010.

(30) Foreign Application Priority Data

Apr. 21, 2009   (JP) .................. 2009-102572

(51) Int. Cl.
*C03B 29/00*   (2006.01)
*B29C 65/00*   (2006.01)
(52) U.S. Cl. ............... 156/89.12; 156/60; 156/89.11
(58) Field of Classification Search ............ 156/89.12, 156/89.11, 60
See application file for complete search history.

(56) References Cited

U.S. PATENT DOCUMENTS

| | | | |
|---|---|---|---|
| 5,254,191 A | | 10/1993 | Mikeska et al. |
| 5,300,163 A | * | 4/1994 | Ohtaki ............... 156/89.15 |
| 5,370,759 A | * | 12/1994 | Hakotani et al. ........ 156/73.1 |
| 5,387,474 A | | 2/1995 | Mikeska et al. |
| 5,474,741 A | | 12/1995 | Mikeska et al. |
| 5,726,863 A | * | 3/1998 | Nakayama et al. ......... 361/794 |
| 6,300,576 B1 | * | 10/2001 | Nakamura et al. .......... 174/261 |
| 6,606,237 B1 | * | 8/2003 | Naito et al. .............. 361/306.3 |
| 6,776,861 B2 | * | 8/2004 | Wang et al. ............. 156/89.11 |
| 2006/0194032 A1 | * | 8/2006 | Furuse et al. ............ 428/210 |
| 2009/0053532 A1 | * | 2/2009 | Iida ..................... 428/426 |
| 2010/0035033 A1 | * | 2/2010 | Saito ..................... 428/213 |

FOREIGN PATENT DOCUMENTS

| | | | |
|---|---|---|---|
| JP | 04-243978 A | | 9/1992 |
| JP | 05327218 A | * | 12/1993 |
| JP | 06-171976 A | | 6/1994 |
| JP | 2001-114556 A | | 4/2001 |
| JP | 2004-281989 A | | 10/2004 |
| JP | 2005-039164 A | | 2/2005 |
| JP | 2006120779 A | * | 5/2006 |

OTHER PUBLICATIONS

Official Communication issued in International Patent Application No. PCT/JP2010/050322, mailed on Feb. 16, 2010.

* cited by examiner

*Primary Examiner* — Philip Tucker
*Assistant Examiner* — Alex Efta
(74) *Attorney, Agent, or Firm* — Keating & Bennett, LLP

(57) ABSTRACT

In a method for producing a multilayer ceramic substrate by a non-shrinkage process, even when a total area of surface electrodes on a first principal surface side is smaller than that on a second principal surface side, a favorable balance in terms of a time period from softening to crystallization of glass is achieved between the first principal surface side and the second principal surface side, thereby allowing all base material layers to be densified and prevented from causing cracks or warpage, even when the crystallization temperature is lowered to prevent production of a reaction layer. The crystallization temperature of a glass material included in a second base material layer defining a second principal surface with a larger total area of surface electrodes is less than that of a glass material included in a first base material layer defining a first principal surface.

8 Claims, 2 Drawing Sheets

METHOD FOR PRODUCING MULTILAYER CERAMIC SUBSTRATE

This Application is a continuation of PCT/JP2010/050322, filed Jan. 14, 2010.

BACKGROUND OF THE INVENTION

1. Field of the Invention

The present invention relates to a method for producing a multilayer ceramic substrate, and more particularly, a method for producing a multilayer ceramic substrate by applying a so-called non-shrinkage process.

2. Description of the Related Art

As described in, for example, Japanese Patent Application Laid-Open No. 4-243978, in a method for producing a multilayer ceramic substrate by applying a so-called non-shrinkage process, an unfired multilayer ceramic substrate is prepared which is composed of a plurality of unfired and stacked base material layers containing a low-temperature sintering ceramic material as their main constituent, and constraining layers containing, as their main constituent, a sintering-resistant ceramic powder that is not substantially sintered at the sintering temperature of the low-temperature sintering ceramic material mentioned above are placed on, for example, both principal surfaces of the unfired multilayer ceramic substrate.

Then, the unfired composite laminate body composed of the unfired multilayer ceramic substrate and constraining layers described above is subjected to firing at the sintering temperature of the low-temperature sintering ceramic material. This firing provides a sintered multilayer ceramic substrate sandwiched between the constraining layers.

In the firing step, the sintering-resistant ceramic powder contained in the constraining layers is not substantially sintered, and the constraining layers thus have no substantial shrinkage caused. For this reason, the constraining layers constrain the base material layers, and thus, the base material layers are substantially shrunk only in the thickness direction, while the shrinkage of the base material layers is suppressed in the principal surface direction. As a result, the obtained multilayer ceramic substrate is less likely to undergo non-uniform deformation, and the accuracy can be improved for the shape and dimensions of the multilayer ceramic substrate in the planar direction.

Next, the constraining layers described above are removed, thereby extracting the desired multilayer ceramic substrate. In this case, the constraining layers can be removed easily because of their porous characteristics.

In the non-shrinkage process as described above, it is known that reactive layers are produced at the interfaces between the base material layers and the constraining layers. The reactive layer refers to a layer produced by upward penetration of glass included in the base material layer toward the constraining layer and chemical reaction of the glass with an inorganic material constituting the constraining layer. The reactive layer is produced by the chemical reaction, thus less likely to be removed as compared with the porous constraining layers, and may be slightly left on the obtained multilayer ceramic substrate. In particular, if the reactive layer is left on a surface electrode, the platability and wire bonding property with respect to the surface electrode will be decreased, thereby leading to a problem that defective mounting is more likely to be caused. Thus, it is desired that the upward penetration of the glass will be suppressed to prevent the production of a reactive layer.

In this regard, for example, Japanese Patent Application Laid-Open No. 6-171976 and Japanese Patent Application Laid-Open No. 2001-114556 disclose the capability to achieve a stable crystallization temperature by the addition of a seed crystal to the entire base material layer.

Thus, when the technique described in these Japanese Patent Application Laid-Open No. 6-171976 and Japanese Patent Application Laid-Open No. 2001-114556 is applied to the non-shrinkage process described in Japanese Patent Application Laid-Open No. 4-243978 mentioned above, the crystallization temperature at the base material layer can be lowered by the addition of a seed crystal. This lowered crystallization temperature can make an adjustment so as to reduce upward penetration of glass from the base material layer to the constraining layer, and suppress the production of a reactive layer to some extent. This is because the upward penetration of the glass is affected by the amount of glass flowing from the softening temperature of the glass to the crystallization temperature thereof.

However, when the technique of adding a seed crystal in an equal amount to the entire base material layer as described in Japanese Patent Application Laid-Open No. 6-171976 and Japanese Patent Application Laid-Open No. 2001-114556 is applied to the non-shrinkage process described in Japanese Patent Application Laid-Open No. 4-243978, the following problem may be caused.

On at least one principal surface of a multilayer ceramic substrate, typically, surface electrodes are formed. As for the total area of the surface electrodes, the total area on one principal surface side of the multilayer ceramic substrate and the total area on the other principal surface side thereof are rarely equal to each other. When the total area of the surface electrodes on one principal surface side of the multilayer ceramic substrate and the total area of the surface electrodes on the other principal surface side thereof are different from each other, the result is that the one and the other principal surfaces of the multilayer ceramic substrate will have different periods of time from each other from the softening temperature to the crystallization temperature. More specifically, the result is that the one and the other principal surfaces of the multilayer ceramic substrate will have the same crystallization temperature, but have different softening temperatures from each other. This is because the metal diffuses during firing to act to lower the softening temperature of the glass included in the base material layer in the vicinity of the surface electrodes, thus resulting in the softening temperature being lowered more on the principal surface side with the larger total area of the surface electrodes.

Thus, when the total area of surface electrodes is, for example, smaller on a first principal surface side and larger on a second principal surface side, the crystallization temperature will be adjusted depending on the second principal surface with the larger total area of the surface electrodes, in order to suppress the production of a reactive layer. Then, however, at the first principal surface with the smaller total area of the surface electrodes, the period of time from the softening temperature to the crystallization temperature will be excessively shortened to start crystallization before densification is completed, thereby resulting in the production of a porous base material layer with a lot of pores on the first principal surface side. This condition not only will decrease the plating resistance of the base material layer which provides the first principal surface, but also may cause the ingress of a plating solution into the pores to adversely affect the electrical characteristics.

It is to be noted that the fact that the total area of surface electrodes on one principal surface side of a multilayer ceramic substrate and the total area of surface electrodes on the other principal surface side thereof are different from each other includes cases in which surface electrodes are formed only on one principal surface of a multilayer ceramic substrate, but not formed on the other principal surface thereof.

SUMMARY OF THE INVENTION

Therefore, preferred embodiments of the present invention provide a method for producing a multilayer ceramic substrate, which prevent production of a reactive layer on a principal surface of the multilayer ceramic substrate while solving the problems described above.

According to a preferred embodiment of the present invention, a method for producing a multilayer ceramic substrate includes the steps of preparing an unfired composite laminate body including an unfired multilayer ceramic substrate including a plurality of unfired base material layers stacked on each other, the unfired base material layers each containing, as their main constituent, a low-temperature sintering ceramic material including a glass material, and including first and second constraining layers containing, as their main constituent, a sintering-resistant ceramic powder which is not substantially sintered at a sintering temperature of the low-temperature sintering ceramic material, the first and second constraining layers respectively placed on first and second principal surfaces of the unfired multilayer ceramic substrate, which are opposed to each other; firing the unfired composite laminate body at the sintering temperature of the low-temperature sintering ceramic material, thereby obtaining a sintered multilayer ceramic substrate; and removing the first and second constraining layers to extract the sintered multilayer ceramic substrate. In this case, the low-temperature sintering ceramic material may include only a glass material, or may include a glass material and a ceramic material.

In addition, in a preferred embodiment of the present invention, a surface electrode is preferably formed on at least one of the first and second principal surfaces of the unfired multilayer ceramic substrate described above, on the assumption that the total area of the surface electrode is smaller on the first principal surface side than the second principal surface side.

In this method for producing a multilayer ceramic substrate, in order to solve the technical problems described previously, the plurality of base material layers provided for the unfired multilayer ceramic substrate preferably includes at least a first base material layer which provides the first principal surface and a second base material layer which provides the second principal surface, and a glass material included in the second base material layer has a lower crystallization temperature than a glass material included in the first base material layer.

It is to be noted that what degree of difference is to be produced in crystallization temperature between the first base material layer and the second base material layer is not able to be determined unambiguously, but determined on the grounds of a degree of difference in the total area of the surface electrode, etc.

In addition, the glass material described above may not only have a glass state at the unfired stage, but may also have glass produced at the firing stage.

In a preferred embodiment of the present invention, the difference is preferably about 1° C. or more and about 15° C. or less, for example, between the crystallization temperature of the glass material included in the first base material layer and the crystallization temperature of the glass material included in the second base material layer.

In addition, the second base material layer preferably includes a seed crystal. In this preferred embodiment, when the first base material layer also includes a seed crystal, the amount of the seed crystal included in the first base material layer is smaller than the amount of the seed crystal included in the second base material layer. It is to be noted that the seed crystal refers to a crystal added to promote crystallization.

The difference between the amount of the seed crystal included in the first base material layer and the amount of the seed crystal included in the second base material layer is preferably about 0.04 weight % or more and about 0.11 weight % or less, for example.

The base material layers occupying about 90% or more of the total thickness of the plurality of base material layers provided for the unfired multilayer ceramic substrate are preferably composed of the same material.

The glass material included in the first base material layer and the glass material included in the second base material layer are preferably equal in terms of composition to each other.

The surface electrode preferably contains Ag.

According to various preferred embodiments of the present invention, the crystallization temperature of the glass material included in the second base material layer which provides the second principal surface with the larger total area of the surface electrode is made lower than the crystallization temperature of the glass material included in the first base material layer which provides the first principal surface with the smaller total area of the surface electrode. Thus, the second base material layer preferably has a crystallization temperature that is low enough to compensate for a decrease in the softening temperature of the glass due to diffusion of the metal from the surface electrode.

In other words, the crystallization temperature of the glass material included in the first base material layer which provides the first principal surface with the smaller total area of the surface electrode is made higher than the crystallization temperature of the glass material included in the second base material layer which provides the second principal surface with the larger total area of the surface electrode. Thus, the first base material layer preferably has a relatively high crystallization temperature since the softening temperature of the glass is less likely to be decreased due to diffusion of the metal from the surface electrode.

Therefore, the crystallization temperature can be lowered in order to prevent production of a reactive layer, while adjusting the period of time from the softening temperature to the crystallization temperature to produce no substantial difference between the first base material layer and the second base material layer, in other words, while achieving a favorable balance in terms of the amount of glass flow between the first base material layer and the second base material layer.

Accordingly, the reduction in crystallization temperature makes it possible to prevent production of a reactive layer without any problem, and prevent crystallization from being started before completing the densification of the base material layers, thereby allowing for densification of all of the base material layers provided for the multilayer ceramic substrate.

In various preferred embodiments of the present invention, when the difference is about 1° C. or more between the crystallization temperature of the glass material included in the first base material layer and the crystallization temperature of the glass material included in the second base material layer, the effects and advantages described above can be achieved with more certainty. On the other hand, a difference in crystallization temperature greater than about 15° C. may excessively increase the difference in sintering behavior between the first base material layer and the second base material layer, thereby resulting in a multilayer ceramic substrate obtained with warpage caused and with peeling or cracking caused between the base material layers. However, when the difference in crystallization temperature is about 15° C. or less, these disadvantages can be surely prevented from being caused.

When the second base material layer includes a seed crystal, the glass is more likely to be crystallized, and the crystallization temperature of the second base material layer can be thus lowered easily.

The addition of the seed crystal stabilizes the crystallization temperature. Thus, when the seed crystal is also included in the first base material layer while the amount of the seed crystal included in the first base material layer is made smaller than the amount of the seed crystal included in the second base material layer, the adjustment of the crystallization temperature is easier for both of the first and second base material layers.

When the difference is about 0.04 weight % or more between the amount of the seed crystal included in the first base material layer and the amount of the seed crystal included in the second base material layer, the difference can be provided with certainty between the crystallization temperature of the glass material included in the first base material layer and the crystallization temperature of the glass material included in the second base material layer, and thus, the effects and advantages of various preferred embodiments of the present invention can be achieved with more certainty. On the other hand, when the difference in the amount of the seed crystal is about 0.11 weight % or less, the difference in sintering behavior can be prevented from being excessively increased between the first base material layer and the second base material layer, and thus, the obtained multilayer ceramic substrate can be prevented with certainty from causing warpage and causing peeling or cracking between the base material layers.

When the base material layers occupying about 90% or more of the total thickness of the plurality of base material layers provided for the unfired multilayer ceramic substrate are composed of the same material, the base material layers occupying about 90% or more of the thickness will have effective control over the coefficient of thermal expansion as the whole multilayer ceramic substrate. Therefore, the obtained multilayer ceramic substrate can be prevented from causing warpage.

When the glass material included in the first base material layer and the glass material included in the second base material layer are equal to each other in terms of composition, the composition is suitable for co-firing, and makes the adjustment of the crystallization temperatures easier.

When the surface electrode contains Ag, the significance of preferred embodiments of the present invention is more remarkable because Ag is more likely to diffuse.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
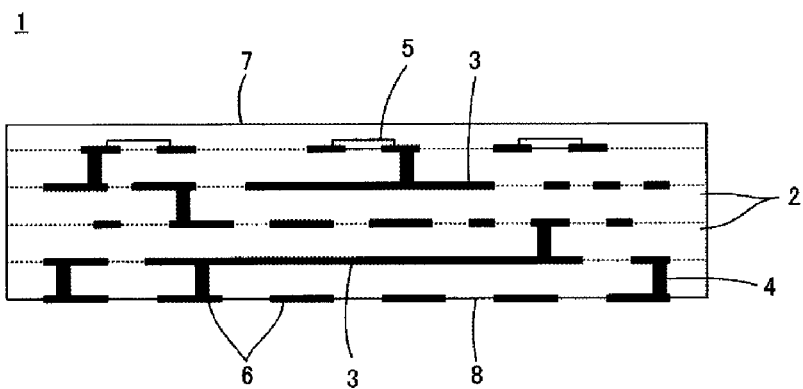
FIG. 1 is a cross-sectional view schematically illustrating a first example of a multilayer ceramic substrate produced by a production method according to a preferred embodiment of the present invention.

First, the structure of a multilayer ceramic substrate produced by a production method according to a preferred embodiment of the present invention will be described with reference to FIG. 1.

A multilayer ceramic substrate 1 includes a plurality of base material layers 2 stacked on each other. In addition, the multilayer ceramic substrate 1 includes wiring conductors. The wiring conductors are intended to constitute passive elements such as, for example, capacitors and inductors, or provide connection wiring such as electrical connections between elements.

The wiring conductors include several internal electrodes 3 and via hole conductors 4 provided inside the multilayer ceramic substrate 1. In addition, the multilayer ceramic substrate 1 includes thick film resistors 5 provided therein. Furthermore, the wiring conductors include several surface electrodes 6 provided on the outer surface of the multilayer ceramic substrate 1. In this preferred embodiment, the surface electrodes 6 are preferably located, with respect to first and second principal surfaces 7 and 8 of the multilayer ceramic substrate 1 opposed to each other, only on the second principal surface 8, but not located on the first principal surface 7. Therefore, it turns out that the total area of the surface electrodes is smaller on the first principal surface 7 side than on the second principal surface 8 side.

A method for producing the multilayer ceramic substrate 1 described above will be described with reference to FIG. 2. The multilayer ceramic substrate 1 shown in FIG. 1 is obtained through a step of firing an unfired composite laminate body 10 shown in FIG. 2.

The unfired composite laminate body 10 includes an unfired multilayer ceramic substrate 11 corresponding to the multilayer ceramic substrate 1, and includes first and second constraining layers 21 and 22 respectively placed on first and second principal surfaces 17 and 18 of the unfired multilayer ceramic substrate 11 opposed to each other.

In addition, the unfired multilayer ceramic substrate 11 includes unfired base material layers 12 corresponding to the base material layers 2, unfired internal electrodes 13 corresponding to the internal electrodes 3, unfired via hole conductors 14 corresponding to the via hole conductors 4, unfired thick film resistors 15 corresponding to the thick film resistors 5, and unfired surface electrodes 16 corresponding to the surface electrodes 6.

In order to prepare this unfired composite laminate body 10, prepared typically are ceramic green sheets to serve as the unfired base material layers 12, the respective unfired internal electrodes 13, a conductive paste to form the via hole conductors 14 and the surface electrodes 16, a resistor paste to form the unfired thick film resistors 15, as well as ceramic green sheets to form constraining layers, to serve as the constraining layers 21 and 22. For the shape formation of these green sheets, for example, a doctor blade method is preferably used.

The ceramic green sheets to serve as the unfired base material layers 12 contain, as their main constituent, a low-temperature sintering ceramic material including a glass material. On the other hand, the green sheets to form constraining layers contain, as their main constituent, a sintering-resistant ceramic powder that is not substantially sintered at the sintering temperature of the low-temperature sintering ceramic material mentioned above. In addition, the conductive paste mentioned above contains, as its main constituent, a low melting point metal such as, for example, Ag, Cu, and Au. In addition, the resistor paste mentioned above contains, as its main constituents, for example, a ruthenium dioxide powder and a glass powder.

Next, in order to form the unfired via hole conductors 14, through holes are provided in the specific ceramic green sheets, and filled with the conductive paste. In addition, in order to form the respective unfired internal electrodes 13 and the surface electrodes 16, the conductive paste is printed onto the specific ceramic green sheets. In addition, in order to form the unfired thick film resistors 15, the resistor paste is printed onto the specific ceramic green sheet.

Next, these ceramic green sheets are stacked in a predetermined order, thereby providing the unfired multilayer ceramic substrate 11. Then, the green sheets to form constraining layers are stacked on each of the first and second principal surfaces 17 and 18 of the unfired multilayer ceramic substrate 11 to form the first and second constraining layers 21 and 22.

In the middle of the stacking step described above, and at the stage of the stacking step completed, a pressing step is carried out, if necessary.

It is to be noted that a printing step may be repeated to prepare the unfired multilayer ceramic substrate 11, and further the unfired composite laminate body 10, instead of the method of stacking green sheets prepared in advance as described above.

Next, the unfired composite laminate body 10 described above is subjected to firing at the sintering temperature of the low-temperature sintering ceramic material included in the unfired base material layers 12. In this firing step, the constraining layers 21 and 22 are not substantially sintered, and thus act to suppress and prevent shrinkage in the direction of the principal surface of the unfired multilayer ceramic substrate 11. As a result, the obtained multilayer ceramic substrate 1 has an increased dimensional accuracy.

Next, the multilayer ceramic substrate 1 shown in FIG. 1 is extracted by removing the constraining layers 21 and 22. When the firing step is completed, the constraining layers 21 and 22 are porous and thus can be removed easily.

In the firing step described above, the glass included in the unfired base material layers 12 provided for the unfired multilayer ceramic substrate 11, in particular, a first base material layer 12(A) which provides the first principal surface and a second base material layer 12(B) which provides the second principal surface 18, penetrates the constraining layers 21 and 22 upward to chemically react with the inorganic material constituting the constraining layers 21 and 22, thereby producing a reactive layer.

This reactive layer, which causes the problems described above, is thus desirably prevented from being produced. Therefore, a seed crystal is added to, in particular, the first and second base material layers 12(A) and 12(B). While a sintered body of the same material as the fired base material layers 2 is preferably subjected to grinding and used as the seed crystal, different crystals can be also used as the seed crystal as long as the crystals can promote crystallization. The addition of the crystal seed acts to lower the crystallization temperature of the glass in the base material layers 12(A) and 12(B). Therefore, the period of time from the softening temperature of the glass at which the upward penetration of the glass is caused to the crystallization temperature can be shortened, and as a result, the production of a reactive layer can be prevented.

Figure 2:
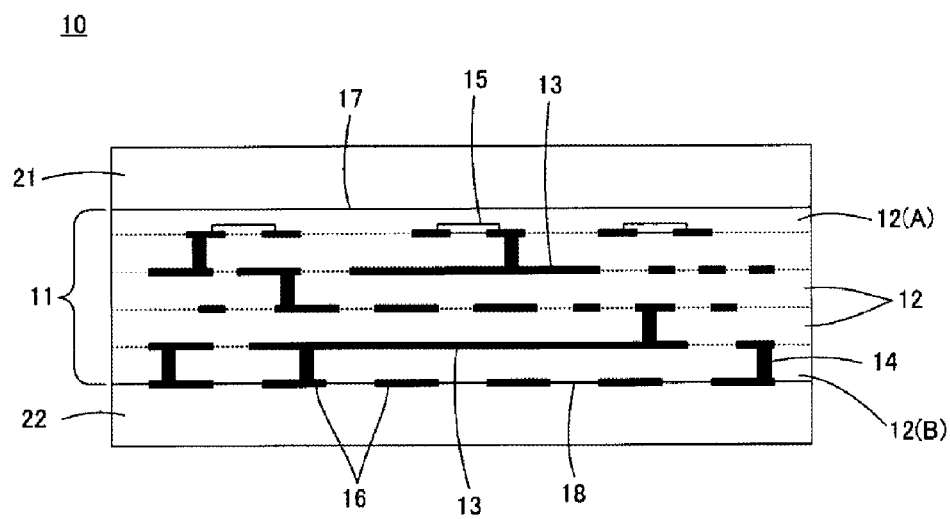
FIG. 2 is a cross-sectional view schematically illustrating an unfired composite laminate body prepared for producing the multilayer ceramic substrate shown in FIG. 1.

On the other hand, as described previously, in the case of the multilayer ceramic substrate 1, the surface electrodes 6 are formed only on the second principal surface 8, but not formed on the first principal surface 7. As far as the unfired multilayer ceramic substrate 11 is concerned, the unfired surface electrodes 16 are formed only on the second principal surface 18, but not formed on the first principal surface 17 as shown in FIG. 2. Accordingly, the total area of the surface electrodes is smaller on the first principal surface 17 side than on the second principal surface 18 side.

In the firing step, in the vicinity of the unfired surface electrodes 16, the metal included in the surface electrode 16 diffuses to act to lower the softening temperature of the glass included in the base material layers 12. In particular, when the surface electrodes 16 contain Ag, Ag has the property of being likely to diffuse. As described previously, the surface electrodes 16 are formed only on the second principal surface. Thus, the metal diffuses on the second base material layer 12(b) side, thereby lowering the softening temperature of the glass included in the second base material layer 12(b). Accordingly, as described previously, the softening temperature is also lowered for the second base material layer 12(B) in spite of the crystallization temperature lowered, and as a result, the period of time from the softening temperature to the crystallization temperature is not shortened so that the production of a reactive layer is not prevented.

From another point of view, when an adjustment is made in such a way that the crystallization temperature is lowered depending on the second base material layer 12(B) with the softening temperature lowered, the period of time from the softening temperature to the crystallization temperature is excessively shortened for the first base material layer 12(A) to start crystallization before densification is completed, which provides the first base material layer 12(A) having a porous condition.

In order to solve these problems, the crystallization temperature of the glass material included in the second base material layer 12(B) is made lower than that of the glass material included in the first base material layer 12(A). This can achieve a favorable balance in terms of the amount of glass flow between the first base material layer 12(A) and the second base material layer 12(B), and achieve densification for all of the base material layers 2 provided for the multilayer ceramic substrate 1 while suppressing the production of a reactive layer.

As for the crystallization temperature described above, the difference is preferably about 1° C. or more and about 15° C. or less between the crystallization temperature of the glass material included in the first base material layer 12(A) and the crystallization temperature of the glass material included in the second base material layer 12(B). When the difference in crystallization temperature is about 1° C. or more, the effect described above can be achieved with more certainty. On the other hand, when the difference is about 15° C. or less, the difference in sintering behavior will not be excessively increased between the first base material layer 12(A) and the second base material layer 12(B), and thus, the obtained multilayer ceramic substrate 1 can be prevented with certainty from causing warpage and causing peeling or cracking between the base material layers 2.

While the seed crystal described previously may be included only in the unfired second base material layer 12(B), the seed crystal is preferably also included in the unfired first base material layer 12(A). In this case, the amount of the seed crystal included in the first base material layer 12(A) is made smaller than the amount of the seed crystal included in the second base material layer 12(B). As described above, the seed crystal is included in both of the first and second base material layers 12(A) and 12(B), while the difference is produced in the amount of the seed crystal, thereby making it easy to adjust the crystallization temperatures for each of the first and second base material layers 12(A) and 12(B).

As for the amount of the seed crystal, the difference between the amount of the seed crystal included in the first base material layer 12(A) and the amount of the seed crystal included in the second base material layer 12(B) is preferably about 0.04 weight % or more and about 0.11 weight % or less. When the difference in the amount of the seed crystal is about 0.04 weight % or more, the difference in the crystallization temperature of the glass material can be produced with certainty between the first base material layer 12(A) and the second base material layer 12(B). On the other hand, when the difference is about 0.11 weight % or less, the difference in sintering behavior can be prevented from being excessively increased between the first base material layer 12(A) and the second base material layer 12(B), and as a result, the multilayer ceramic substrate 1 can be prevented with certainty from causing warpage and causing peeling or cracking between the base material layers 2.

The glass material included in the unfired first base material layer 12(A) and the glass material included in the unfired second base material layer 12(B) are preferably equal in terms of composition to each other. More preferably, the composition is made common to the glass materials included in all of the unfired base material layers 12 provided for the unfired multilayer ceramic substrate 11. This can provide a more suitable condition for co-firing, and makes it easier to adjust the crystallization temperatures.

In addition, the base material layers 12 occupying about 90% or more of the total thickness of the plurality of base material layers 12 provided for the unfired multilayer ceramic substrate 11 are preferably composed of the same material. For example, as for the plurality of base material layers 12 provided for the unfired multilayer ceramic substrate 11, when only the first base material layer 12(A) is different in material from the other base material layers 12 including the second base material layer 12(B), and when the other base material layers 12 including the second base material layer 12(B) are all composed of the same material, warpage is more likely to be caused as the first base material layer 12(A) is thicker. In this case, warpage is caused for the following reason.

The second base material layer 12(B) with a relatively large additive amount of a seed crystal varies in coefficient of thermal expansion according to the coefficient of thermal expansion of a precipitated crystalline phase, rather than the first base material layer 12(A), and the difference in compressive stress, resulting from the difference in coefficient of thermal expansion, causes the warpage.

When the base material layers 12 composed of the same material as the second base material layer 12(B) accounts for a substantial fraction of the thickness as described previously, the compressive stress itself will be small, which results from the thinner first base material layer 12(A). In addition, the compressive stress resulting from the first base material layer 12(A) is dispersed by the base material layers 12 which account for a substantial fraction of the thickness and have the same material as the second base material layer 12(B). Accordingly, when the base material layers 12 composed of the same material accounts for about 90% or more of the thickness, the base material layers 12 will have effective control over the coefficient of thermal expansion as the whole multilayer ceramic substrate 1. Thus, the difference in compressive stress, resulting from the difference in coefficient of thermal expansion, can be reduced, so that the multilayer ceramic substrate 1 can be prevented from causing warpage.

It is to be noted that the base material layers 12 composed of the same material, which account for about 90% or more of the thickness, may, besides the case of having the same material as the second base material layer 12(B) as in the case of the example described above, have the same material as the first base material layer 12(A), or may be regarded as only the base material layers 12 located midway therein, rather than any of the first and second base material layers 12(A) and 12(B).

Figure 3:
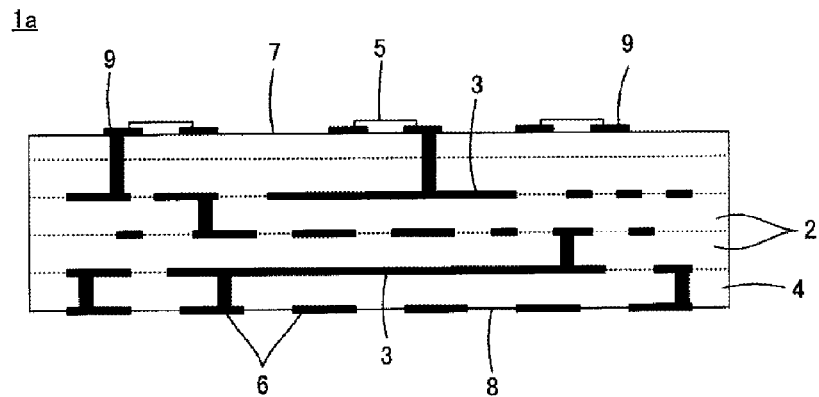
FIG. 3 is a cross-sectional view schematically illustrating a second example of a multilayer ceramic substrate produced by a production method according to a preferred embodiment of the present.
Figure 4:
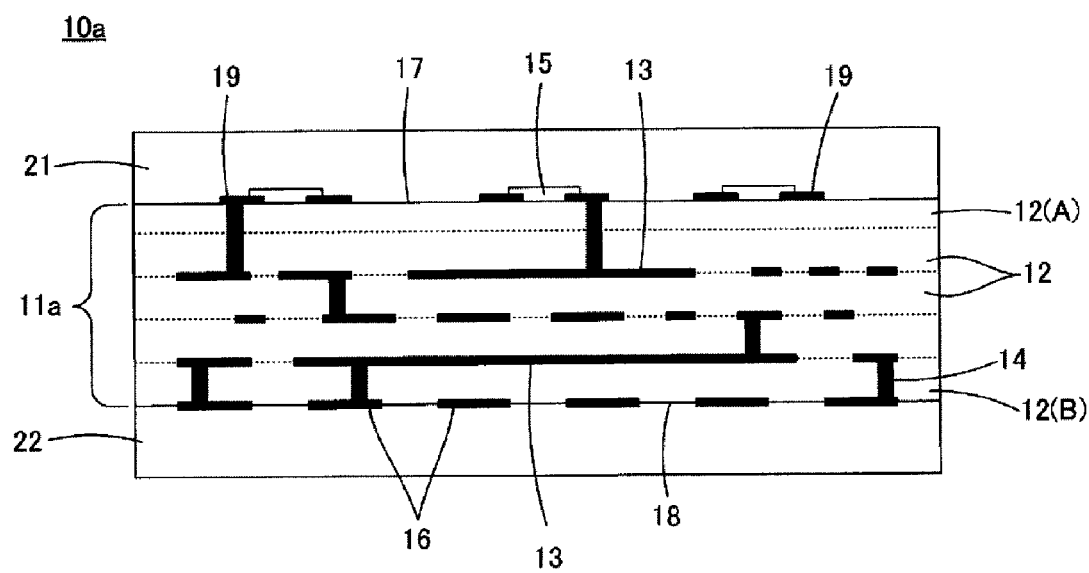
FIG. 4 is a cross-sectional view schematically illustrating an unfired composite laminate body prepared for producing the multilayer ceramic substrate shown in FIG. 3.

FIGS. 3 and 4 are diagrams respectively corresponding to FIGS. 1 and 2, for illustrating a second example of a multilayer ceramic substrate produced by a production method according to a preferred embodiment of the present invention. In FIGS. 3 and 4, the elements corresponding to the elements shown in FIGS. 1 and 2 are denoted by like reference numerals, and the repeated descriptions of the elements will be omitted.

The multilayer ceramic substrate 1a shown in FIG. 3 is characterized in that surface electrodes 9 are formed on a first principal surface 7, and formed on the first principal surface 7 so that thick film resistors 5 are electrically connected to the surface electrodes 9. Therefore, as shown in FIG. 4, an unfired multilayer ceramic substrate 11a in an unfired composite laminate body 10a includes unfired surface electrodes 19 and thick film resistors 15 formed on a first principal surface 17.

In each case of the multilayer ceramic substrate 1a shown in FIG. 3 and the unfired multilayer ceramic substrate 11a shown in FIG. 4, the multilayer ceramic substrate has the relationship of the smaller total area of the surface electrodes on a side of the first principal surface 7 or 17 than on a side of the second principal surface 8 or 18. More specifically, the total area of the surface electrodes 9 or unfired surface electrodes 19 formed on the first principal surface 7 or 17 of the multilayer ceramic substrate 1a or unfired multilayer ceramic substrate 11a is smaller than the total area of surface electrodes 6 or unfired surface electrodes 16 formed on the second principal surface 8 or 18.

The other structures of the multilayer ceramic substrate 1a shown in FIG. 3 and of the unfired composite laminate body 10a shown in FIG. 4 preferably are substantially the same as in the case of the multilayer ceramic substrate 1 shown in FIG. 1 and the unfired composite laminate body 10 shown in FIG. 2.

Next, a non-limiting experimental example will be described which was carried out for confirming the effects of various preferred embodiments of the present invention.

In this experimental example, the unfired composite laminate body 10 which has a structure as shown in FIG. 2 was prepared to provide, as a sample, the multilayer ceramic substrate 1 having a structure as shown in FIG. 1.

In addition, in this experimental example, in the unfired multilayer ceramic substrate 11 including the first base material layer 12(A) and the second base material layer 12(B), the other base material layers 12 were all configured to have the same crystallization temperature as that of the second base material layer 12(B). Accordingly, in the following description of the experimental example, the term "first base material layer" refers to only the first base material layer 12(A) shown in FIG. 2, whereas the term "second base material layer" refers to not only the second base material layer 12(B) shown in FIG. 2, but also the other base material layers 12.

First, multiple ceramic green sheets were stacked in a predetermined order to prepare an unfired multilayer ceramic substrate, and constraining layers were further placed on both principal surfaces of the unfired multilayer ceramic substrate, and subjected to pressing in the stacking direction, thereby providing an unfired composite laminate body.

In this case, the ceramic green sheets to serve as the unfired first and second base material layers were obtained by forming a predetermined ceramic slurry into the shape of a sheet in accordance with a doctor blade method. The ceramic slurry was prepared by sufficiently mixing $CaO-Al_2O_3-SiO_2-B_2O_3$ based glass with a softening temperature of approximately 720° C., an alumina powder, and a seed crystal in a predetermined ratio, along with a solvent, a dispersant, an organic binder, and a plasticizer. An anorthite seed crystal powder was used as the seed crystal. Then, in the case of the ceramic slurry for forming each of the first and second base material layers, the additive amount of the seed crystal was adopted as shown in Table 1, and the crystallization temperature of the glass was adjusted as shown in Table 1.

In addition, the thickness of the ceramic green sheet to serve as each of the first and second base material layers was set so as to have the thickness after firing as shown in Table 1.

A conductive paste containing Ag as its conductive component was used as the conductive paste for forming internal electrodes, via hole conductors, and surface electrodes. In addition, a mixture of a ruthenium dioxide powder and a glass powder, further mixed with the addition of a vehicle component, was used as the resistor paste for forming thick film resistors.

Furthermore, the constraining layers were formed in such a way that a slurry of an alumina powder blended with a solvent, a dispersant, a binder, and a plasticizer was formed into the shape of a sheet to provide green sheets, and these green sheets were placed on the both principal surfaces of the unfired ceramic substrate.

Next, the unfired composite laminate body was subjected to firing in accordance with a predetermined temperature profile to obtain a sintered multilayer ceramic substrate. The constraining layers were not sintered in this firing step to have a porous condition, and thus removed by ultrasonic cleaning.

Next, the obtained multilayer ceramic substrates according to each sample were evaluated for the incidence of a reactive layer, the presence or absence of crack, and warpage, as shown in Table 1. The incidence of a reactive layer is obtained by evaluating the area ratio of a reactive layer produced in a 100 mm×100 mm region of the multilayer ceramic substrate according to the sample. In addition, as for warpage, the direction of upward warpage of an end of the multilayer ceramic substrate toward the first base material layer was referred to as plus.

TABLE 1

| Sample Number | Crystallization Temperature (° C.) | | Additive Amount of Seed Crystal (weight %) | | Thickness After Firing (μm) | | Incidence of Reactive Layer (%) | | Crack | Warpage (μm) |
|---|---|---|---|---|---|---|---|---|---|---|
| | First Base Material Layer | Second Base Material Layer | First Base Material Layer | Second Base Material Layer | First Base Material Layer | Second Base Material Layer | First Base Material Layer | Second Base Material Layer | | |
| 1 | 946.5 | 941.8 | 0.06 | 0.1 | 8 | 110 | 0 | 0 | No | +78 |
| 2 | 945.3 | 941 | 0.07 | 0.12 | 15 | 300 | 0 | 0 | No | +65 |
| 3 | 943 | 940.5 | 0.09 | 0.13 | 25 | 500 | 0 | 0 | No | +82 |
| 4 | 941.8 | 939.3 | 0.1 | 0.15 | 32 | 700 | 0 | 0 | No | +90 |
| 5 | 950.8 | 939.3 | 0.04 | 0.15 | 30 | 700 | 0 | 0 | No | +88 |
| 6 | 945.3 | 938.5 | 0.07 | 0.17 | 30 | 600 | 0 | 0 | No | +85 |
| 7 | 955.6 | 935 | 0.03 | 0.20 | 20 | 500 | 0 | 0 | Yes | +205 |
| 8 | 945.3 | 938.5 | 0.07 | 0.17 | 100 | 300 | 0 | 0 | No | +220 |
| 9 | 955.6 | 955.6 | 0.03 | 0.03 | 20 | 500 | 0 | 15 | No | +75 |

Samples 1 to 6 have favorable results achieved for all of the incidence of a reactive layer, crack, and warpage. These samples 1 to 6 satisfy the conditions that the crystallization temperature of the second base material layer is lower than that of the first base material layer, the difference in crystallization temperature is about 1° C. or more and about 15° C. or less, the difference in the additive amount of the seed crystal is about 0.04 weight % or more and about 0.11 weight % or less between the first base material layer and the second base material layer, and the thickness of the base material layers composed of the same material accounts for about 90% or more.

In addition, sample 7 has favorable results achieved for the incidence of a reactive layer, because the crystallization temperature of the second base material layer is lower than that of the first base material layer. However, between the first base material layer and the second base material layer, the crystallization temperature has a large difference of about 20.6° C., and the additive amount of the seed crystal has a large difference of about 0.17 weight %. Thus, sample 7 has slight crack caused and has large warpage. However, sample 7 can be used as a product without any problems, because the warpage is smaller than about 300 μm.

Sample 8 also has favorable results achieved for the incidence of a reactive layer, because the crystallization temperature of the second base material layer is lower than that of the first base material layer. However, sample 8 has relatively large warpage caused. This is presumed to be because the base material layers composed of the same material fails to account for about 90% or more of the thickness.

In contrast to these samples, sample 9 has reactive layers caused in the second base material layers. This is presumed to be because the crystallization temperature is higher than in the cases of samples 1 to 6.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for producing a multilayer ceramic substrate, comprising the steps of:
    preparing an unfired composite laminate body including an unfired multilayer ceramic substrate including a plurality of unfired base material layers stacked on each other, the unfired base material layers each containing as a main constituent a low-temperature sintering ceramic material including a glass material, and including first and second constraining layers containing as a main constituent a sintering-resistant ceramic powder which is not substantially sintered at a sintering temperature of the low-temperature sintering ceramic material, the first and second constraining layers respectively placed on first and second principal surfaces of the unfired multilayer ceramic substrate, which are opposed to each other;
    firing the unfired composite laminate body at the sintering temperature of the low-temperature sintering ceramic material, thereby obtaining a sintered multilayer ceramic substrate; and
    removing the first and second constraining layers to extract the sintered multilayer ceramic substrate; wherein
    a surface electrode is formed on at least one of the first and second principal surfaces of the unfired multilayer ceramic substrate, a total area of the surface electrode is smaller on a side of the first principal surface than on a side of the second principal surface, the plurality of base material layers provided for the unfired multilayer ceramic substrate includes at least a first base material layer which provides the first principal surface and a second base material layer which provides the second principal surface, and a glass material included in the second base material layer has a lower crystallization temperature than a glass material included in the first base material layer.

2. The method for producing a multilayer ceramic substrate according to claim 1, wherein a difference is about 1° C. or more and about 15° C. or less between the crystallization temperature of the glass material included in the first base material layer and the crystallization temperature of the glass material included in the second base material layer.

3. The method for producing a multilayer ceramic substrate according to claim 1, wherein the second base material layer includes a seed crystal.

4. The method for producing a multilayer ceramic substrate according to claim 3, wherein the first base material layer includes a seed crystal, and an amount of the seed crystal included in the first base material layer is smaller than an amount of the seed crystal included in the second base material layer.

5. The method for producing a multilayer ceramic substrate according to claim 4, wherein a difference between the amount of the seed crystal included in the first base material layer and the amount of the seed crystal included in the second base material layer is about 0.04 weight % or more and about 0.11 weight % or less.

6. The method for producing a multilayer ceramic substrate according to claim 1, wherein the base material layers occupying about 90% or more of a total thickness of the plurality of base material layers provided for the unfired multilayer ceramic substrate include the same material.

7. The method for producing a multilayer ceramic substrate according to claim 1, wherein the glass material included in the first base material layer and the glass material included in the second base material layer are equal to each other in terms of composition.

8. The method for producing a multilayer ceramic substrate according to claim 1, wherein the surface electrode contains Ag.

* * * * *